United States Patent
Okazawa et al.

(10) Patent No.: US 6,939,722 B2
(45) Date of Patent: Sep. 6, 2005

(54) METHOD OF FORMING MAGNETIC MEMORY

(75) Inventors: Takeshi Okazawa, Tokyo (JP); Kiyotaka Tsuji, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/116,634

(22) Filed: Apr. 4, 2002

(65) Prior Publication Data

US 2002/0146851 A1 Oct. 10, 2002

(30) Foreign Application Priority Data

Apr. 6, 2001 (JP) .................................. 2001-109166

(51) Int. Cl.[7] .............................................. H01L 21/00
(52) U.S. Cl. ........................................................ 438/3
(58) Field of Search .................. 438/3, 618, 636–637, 438/945; 216/22; 365/171–173, 157, 158; 360/324.1–324.2, 324.6

(56) References Cited

U.S. PATENT DOCUMENTS

| | | | | |
|---|---|---|---|---|
| 5,640,343 A | * | 6/1997 | Gallagher et al. | 365/171 |
| 5,734,605 A | * | 3/1998 | Zhu et al. | 365/173 |
| 5,841,692 A | * | 11/1998 | Gallagher et al. | 365/173 |
| 5,861,328 A | | 1/1999 | Tehrani et al. | |
| 6,165,803 A | * | 12/2000 | Chen et al. | 438/3 |
| 6,180,444 B1 | * | 1/2001 | Gates et al. | 438/237 |
| 6,211,090 B1 | * | 4/2001 | Durlam et al. | 438/692 |
| 6,297,983 B1 | * | 10/2001 | Bhattacharyya | 365/55 |
| 6,315,913 B1 | | 11/2001 | Engelhardt et al. | |
| 6,351,023 B1 | * | 2/2002 | Gates et al. | 257/623 |
| 6,358,756 B1 | * | 3/2002 | Sandhu et al. | 438/3 |
| 6,391,658 B1 | * | 5/2002 | Gates et al. | 438/3 |
| 6,413,788 B1 | * | 7/2002 | Tuttle | 438/3 |
| 6,426,012 B1 | * | 7/2002 | O'Sullivan et al. | 216/22 |
| 6,440,753 B1 | * | 8/2002 | Ning et al. | 438/3 |
| 6,452,762 B1 | * | 9/2002 | Hayashi et al. | 360/324.1 |
| 6,482,657 B2 | * | 11/2002 | Shimazawa | 438/3 |
| 6,624,987 B1 | * | 9/2003 | Hayashi et al. | 360/324.2 |
| 2001/0009062 A1 | * | 7/2001 | Mikami et al. | 29/603.01 |
| 2001/0022373 A1 | * | 9/2001 | Minakata et al. | 257/295 |
| 2001/0040778 A1 | * | 11/2001 | Abraham et al. | 360/324.2 |
| 2002/0085323 A1 | * | 7/2002 | Smith et al. | 360/324.12 |
| 2002/0096775 A1 | * | 7/2002 | Ning | 257/763 |
| 2002/0097538 A1 | * | 7/2002 | Seyama et al. | 360/324.11 |
| 2002/0132464 A1 | * | 9/2002 | Lee | 438/618 |
| 2002/0146887 A1 | * | 10/2002 | Liu et al. | 438/300 |
| 2002/0154455 A1 | * | 10/2002 | Lenssen | 360/324 |
| 2003/0086217 A1 | * | 5/2003 | Pinarbasi | 360/324.12 |

FOREIGN PATENT DOCUMENTS

JP          2000-339622          12/2000

* cited by examiner

*Primary Examiner*—Long Pham
*Assistant Examiner*—Thao X. Le
(74) *Attorney, Agent, or Firm*—Katten Muchin Rosenman LLP

(57) ABSTRACT

A method of forming a magnetic memory, includes, forming a first magnetic film over a substrate, forming a second magnetic film on the first magnetic film, forming a conductive film on second magnetic film, and forming a resist pattern on the conductive film. Then, a first pattern is formed by etching the conductive film using the resist pattern as a mask and the resist pattern is removed. Then, a first magnetic substance layer is formed by etching the second magnetic film using the first pattern as a mask.

6 Claims, 13 Drawing Sheets

METHOD OF FORMING MAGNETIC MEMORY

BACKGROUND OF THE INVENTION

1. Field of the Invention

The present invention relates to a method of forming a magnetic memory, in particularly, a method of forming a magnetic random access memory that stores data in a nonvolatile manner by utilizing spontaneous magnetization of a metallic ferromagnetic substance.

2. Related Background Art

Magnetic (magnetoresistive) random access memories (hereinafter referred to as the "MRAMs") are under development as one type of semiconductor memories that store data in a nonvolatile manner. In the MRAMS, the direction of spontaneous magnetization of the ferromagnetic film is associated with "1" or "0", which represents a digital data.

Data stored in a MRAM is read by utilizing a magneto-resistance effect that the ferromagnetic substance exhibits. The magneto-resistance effect has two types. One of which is a giant magneto-resistance effect (GMR) and the other is a tunnel magneto-resistance effect (TMR). In the following description, memory cells that use the GMR are referred to as GMR cells and memory cells that use the TMR are referred to as TMR cells.

It is required to process a ferromagnetic film in order to form a memory cell of an MRAM. Under present circumstances, it is difficult to process the ferromagnetic film through chemical dry etching. Therefore, in general, the ferromagnetic film is patterned by ion milling.

FIGS. 3A to 3I show a method of forming a TMR cell of a related art.

As shown in FIG. 3A, a silicon oxide film 102, an aluminum film 103, a first magnetic film 104, an insulating film 105, and a second magnetic film 106 are formed in succession on a substrate 101. As shown in FIG. 3B, a resist pattern 107 is formed on the second ferromagnetic film 106. Then, the second magnetic film 106, the insulating film 105, the first magnetic film 104, and the aluminum film 103 are etched in succession by ion milling using the resist pattern 107 as a mask. As a result of this etching, as shown in FIG. 3C, there are formed a lower electrode 103' and a fixed magnetization (a pinned magnetic) layer 104' of the TMR cell. Further, the resist pattern 107 is removed by ashing in $O_2$ plasma.

As shown in FIG. 3D, a resist pattern 108 is formed on the second magnetic film 106. Then, the second magnetic film 106 and the insulating film 105 are etched by ion milling using the resist pattern 108 as a mask. As a result, as shown in FIG. 3E, there are formed an insulating layer 105' and a free magnetization (free magnetic) layer 106' of the TMR cell. Further, the resist pattern 108 is removed by ashing in $O_2$ plasma. As shown in FIG. 3F, there is formed a silicon oxide film 109, which is an insulating film, on the whole upper surface of the substrate 101.

As shown in FIG. 3G, a resist pattern 110 is formed to form a contact hole. As shown in FIG. 3H, the silicon oxide film 109 is etched using the resist pattern, 110 as a mask, thereby forming a contact hole 111 reaching the free magnetization layer 106'. As shown in FIG. 3I, there is formed a wiring layer 112, which is electrically connected to the free magnetization layer 106', using a conductive material, such as aluminum. In this manner, a TMR cell is formed.

However, such a method arises problems described below. FIG. 4 illustrates a memory cell of a related art to explain the problems. As the first problem, oxide layers 104a' and an oxide layer 106a' are formed on the surfaces of the fixed magnetization layer 104' and the free magnetization layer 106', respectively. As shown in FIG. 3C, the surface of the second ferromagnetic film 106 is exposed to $O_2$ plasma during the removal of the resist pattern 107. Accordingly, the surface of the second ferromagnetic film 106 is oxidized and the oxide layer 106a' is formed on the surface of the free magnetization layer 106'. Similarly, as shown in FIG. 3E, the surface of the fixed magnetization layer 104' is exposed to $O_2$ plasma during the removal of the resist pattern 108. Accordingly, the oxide layers 104a' are formed on the surface of the fixed magnetization layer 104'.

The stated oxidization of the surfaces of the fixed magnetization layer 104' and the free magnetization layer 106' leads to the degradation of characteristics of the TMR cell. Therefore, such oxidization is not preferable.

As the second problem, as shown in FIG. 4, side walls 113 and side walls 114 protruding perpendicular to the substrate 101 are formed on the side surfaces of the free magnetization layer 106' and the fixed magnetization layer 104'. The sidewalls 113 existing on the side surfaces of the fixed magnetization layer 104' are formed during the etching by ion milling shown in FIGS. 3B and 3C. During the etching by ion milling, materials forming the second ferromagnetic film 106, the insulating film 105, the first ferromagnetic film 104, and the aluminum film 103 are sputtered. As a result, the materials adhere to the side surfaces of the resist pattern 107. The adherents are not removed but are left even if the resist pattern 107 is removed by ashing. As a result, the side walls 113 are formed by the adherents. Similarly, the side walls 114 existing on the side surfaces of the free magnetization layer 106' are formed during the etching by ion milling shown in FIGS. 3D and 3E. During this etching, materials forming the second ferromagnetic film 106 and the insulating film 105 are sputtered. As a result, the materials adhere to the side surfaces of the resist pattern 108. The adherents are not removed but are left even if the resist pattern 108 is removed by ashing. As a result, the side walls 114 are formed by the adherents. The height of each of the side walls 113 and the side walls 114 is about the thickness of one of the resist patterns 107 and 108, typically about 1 $\mu$m. The side walls 113 and the side walls 114 having heights of about 1 $\mu$m are unstable and tend to topple over.

Such shapes of the side walls 113 and the side walls 114 lead to defects in the shape of an MRAM and therefore is not preferable. The stated shapes of the side walls 113 and the side walls 114 impair the coverage property of the interlayer insulating film 109. Further, if the side walls 113 and the side walls 114 standing upright topple over, the shape of the interlayer insulating film 109 becomes abnormal. These cause wire breaking and a short circuit of the MRAM and lead to the malfunction of the MRAM.

It is desired that there is provided a technique with which a memory cell of an MRAM is formed while preventing the oxidation of a ferromagnetic film included in the memory cell.

Further, it is desired that there is provided a technique of manufacturing an MRAM in which no malfunction of the MRAM is caused by side walls that have been formed on the side surfaces of a mask during the processing of a ferromagnetic film by ion milling.

It should be noted here that as a technique that may have a relation to the invention disclosed in this patent application, a technique of processing a magnetic substance is disclosed in Japanese Patent Application Laid-open No.

2000-339622. With this publicly known processing technique, a non-magnetic layer is made of alumina on the upper surface of a magnetic film. The magnetic film is etched by ion milling using this non-magnetic layer as a mask.

However, the Japanese Patent Application Laid-open No. 2000-339622 does not disclose the stated problem that the surface of a metallic ferromagnetic substance is oxidized. This publicly known processing technique is a method of forming a magnetic pole of a thin film magnetic head. The magnetic film of the thin film magnetic head is extremely thicker than the ferromagnetic film used in an MRAM. Therefore, the oxidation of the surface of the magnetic film does not become a considerable problem in the thin-film magnetic head. On the other hand, in a memory cell of an MRAM made of a ultra-thin metallic ferromagnetic substance, the oxidation of the surface of the ferromagnetic film may become a problem that influences the reliability of the memory.

SUMMARY OF THE INVENTION

It is an object of the present invention to provide a method of forming a memory cell of an MRAM while suppressing the oxidation of a ferromagnetic film included in the memory cell.

It is an another object of the present invention to provide a method for preventing defects in the shape of an MRAM from occurring due to side walls formed on the side surfaces of a mask during the processing of a ferromagnetic film by ion milling.

A method of forming a magnetic memory includes, forming a magnetic film over a semiconductor substrate and forming a hard mask on the magnetic film; and patterning the magnetic film using the hard mask as a mask.

Here, the hard mask is not a film that exhibits such phenomena as development and exposure, like a resist (photoresist), but refers to a film that is made of an oxide film, nitride film, metal, or the like.

A method of forming a magnetic memory, includes, forming a first magnetic film over a substrate, forming a second magnetic film over the first magnetic film, forming a conductive film on the second magnetic film, forming a resist pattern on the conductive film, forming a first pattern by etching the conductive film using the resist pattern as a mask, removing the resist pattern, forming a first magnetic substance layer by etching the second magnetic film using the first pattern as a mask, forming an interlayer insulation layer covering the first magnetic substance layer, forming a contact hole that passes through the interlayer insulating layer to expose the first pattern.

A contact portion, in which the magnetic substance layer and the mask pattern contact each other, is not exposed during the removal of the resist pattern. Therefore, this contact portion is resistant to oxidation. Further, the resist pattern is removed during the etching of the magnetic film. Therefore, a material forming the magnetic film is not deposited on the side surfaces of the resist pattern. That is, the material is not deposited on the side surfaces of the resist pattern and side walls protruding from the substrate are formed. As a result, the occurrence of defects in the shape of an MRAM is prevented.

Here, it is preferable that the method of manufacturing the magnetic memory further includes forming side walls on the side surfaces of the mask pattern and the magnetic substance layer. The side walls are formed by depositing a material forming the magnetic film adhere to the side surfaces during the etching of the magnetic film. Therefore, the side surfaces of the magnetic substance layer are covered with the side walls and become resistant to oxidation.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Figure 1A:
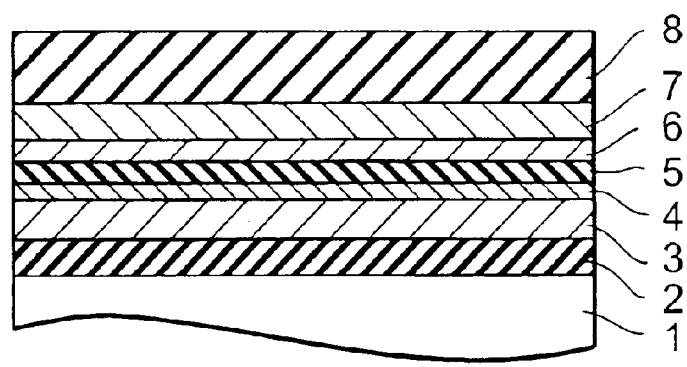
FIGS. 1A to 1O are cross sectional views each showing a method of manufacturing a magnetic memory of a first embodiment.
Figure 1B:
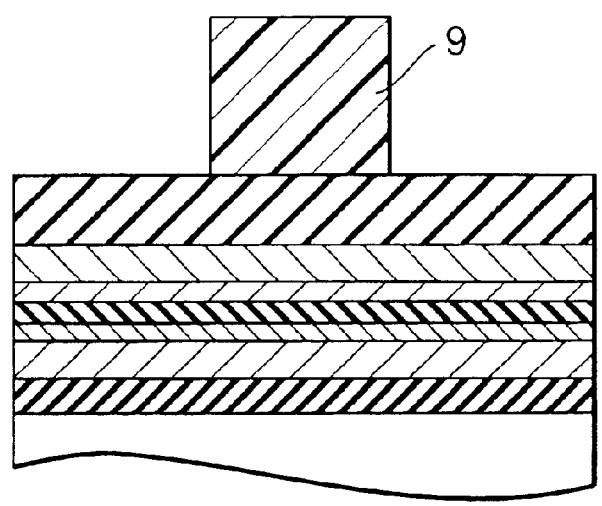
Figure 1C:
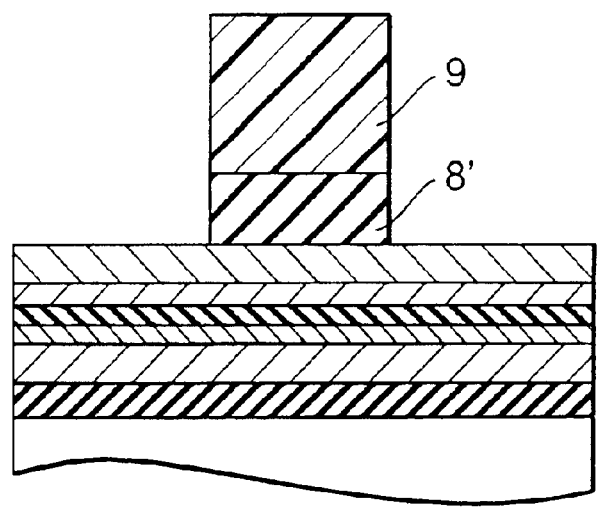
Figure 1D:
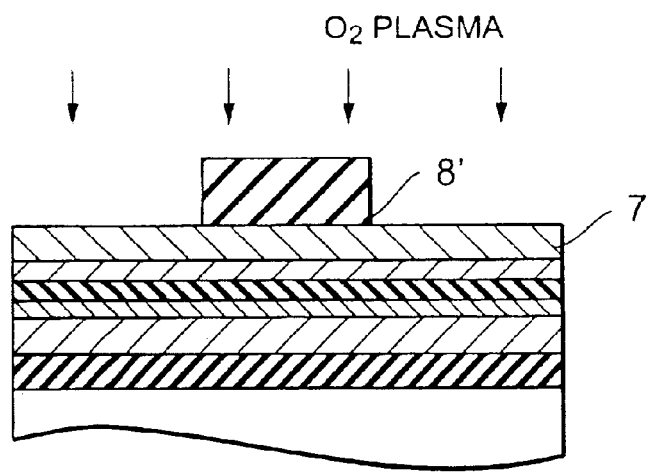
Figure 1E:
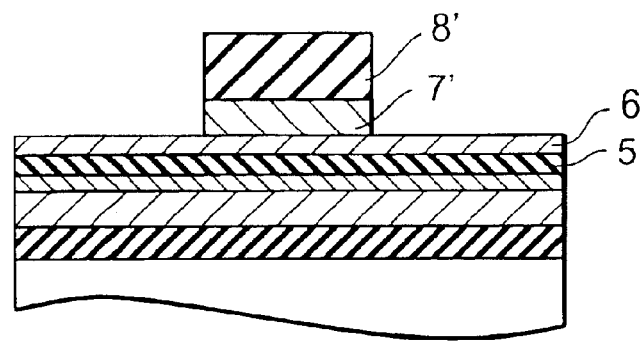
Figure 1F:
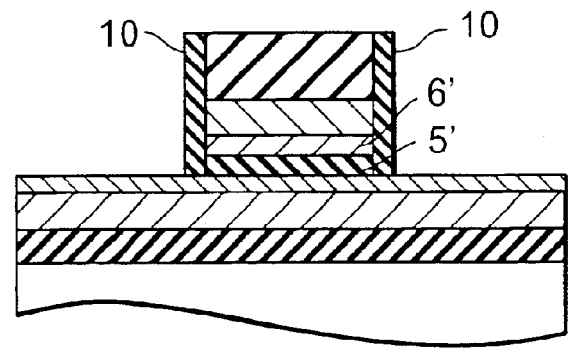
Figure 1G:
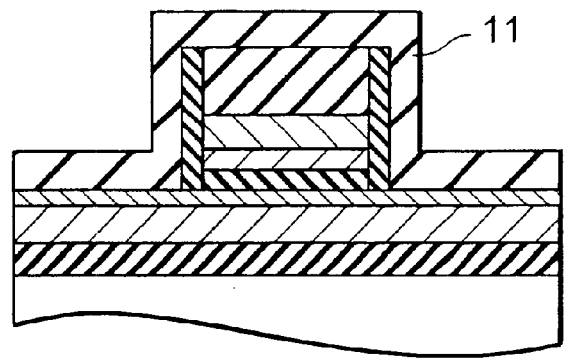
Figure 1H:
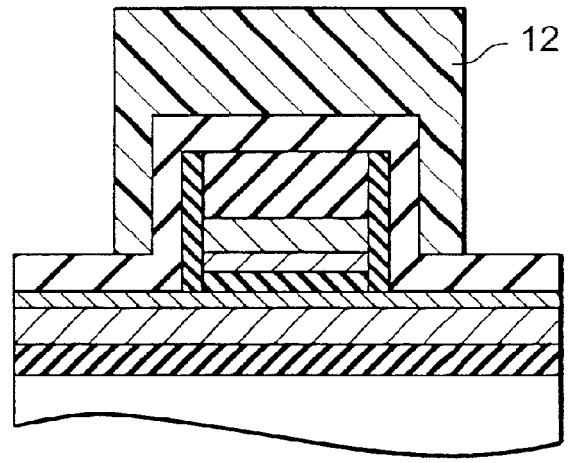
Figure 1I:
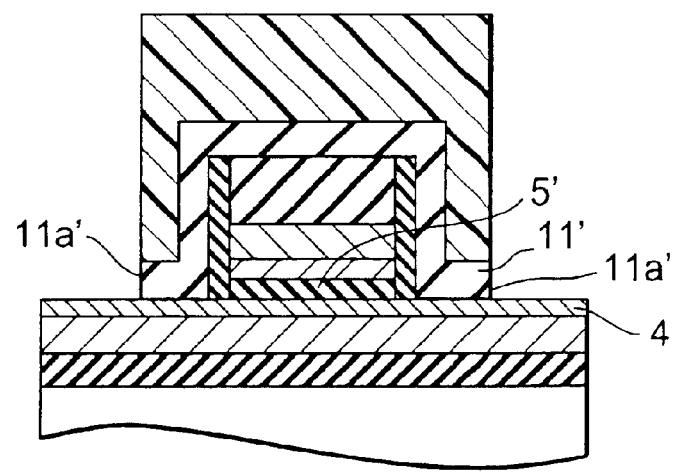
Figure 1J:
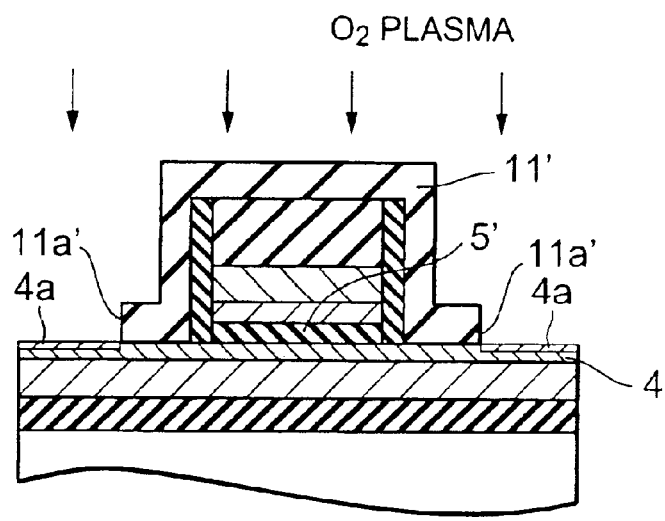
Figure 1K:
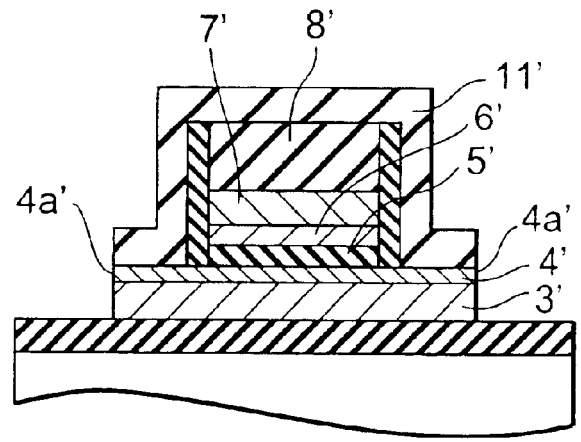
Figure 1L:
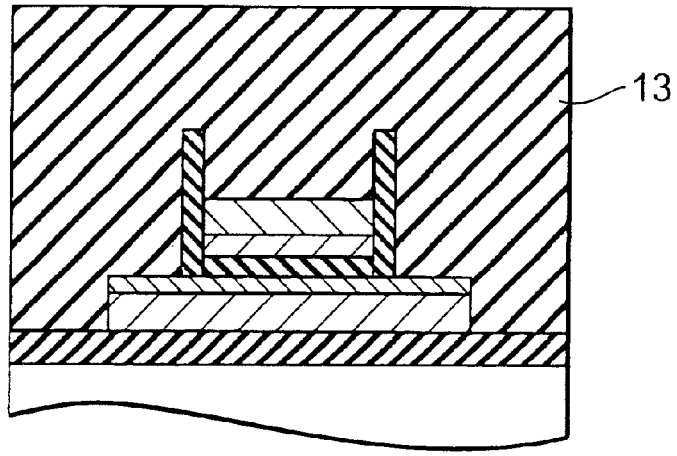
Figure 1M:
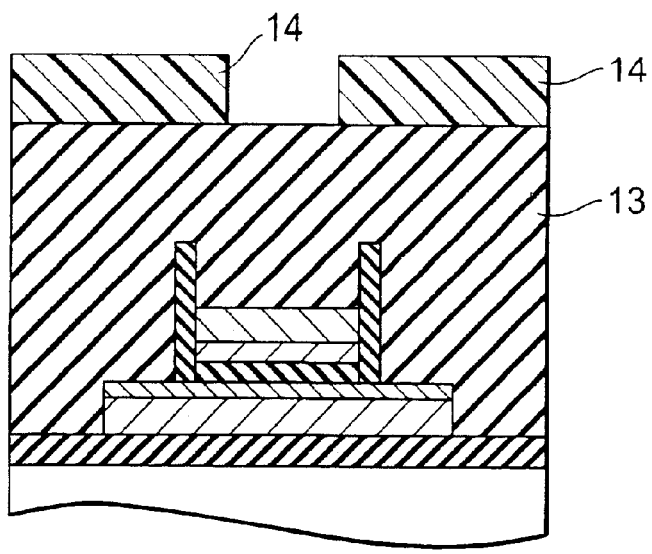
Figure 1N:
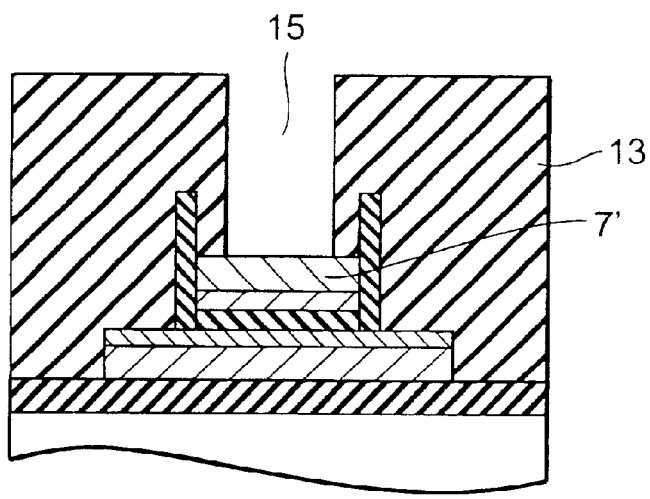
Figure 1O:
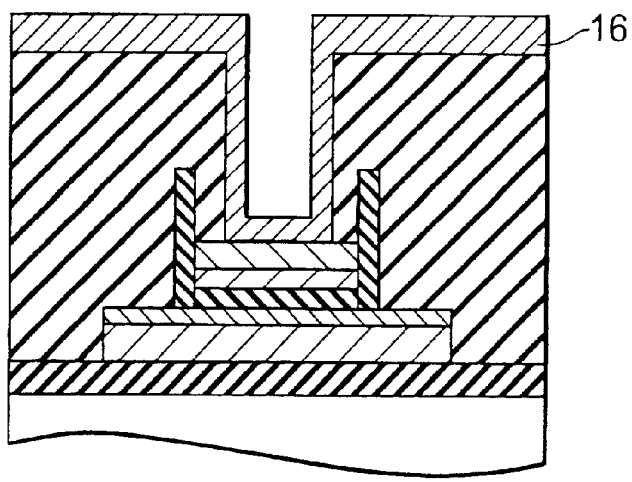

Turning now to the drawings, FIGS. 1A to 1O are sectional views each illustrating the respective process of forming a magnetic memory according to a first embodiment of the present invention.

Referring to FIG. 1A, a silicon oxide film 2, an aluminum film 3, a first magnetic film 4, an insulating film 5, a second magnetic film 6, a titanium nitride film 7, and a silicon oxide film 8 are formed in succession on a substrate 1. The thickness of the aluminum film 3 is about 30.0 nm. The first magnetic film 4 and the second magnetic film 6 are each made of a metallic ferromagnetic substance, such as iron, nickel, cobalt, or permalloy (NiFe). The insulating film 5 is made of an insulating material, such as alumina ($Al_2O_3$) or hafnhium oxide. The insulating film 5 has a thickness of about 1.5 nm and is extremely thin to allow a tunnel current to flow. Further, the sum of the thickness of the first magnetic film 4, the insulating film 5, and the second magnetic film 6 is extremely small and is about 30 nm or less. The thickness of the titanium nitride film 7 is about 50.0 nm. The thickness of the silicon oxide film 8 is about 100.0 nm. To prevent the oxidation of the first magnetic film 4 and the second magnetic film 6, it is preferable that the aluminum film 3, the first magnetic film 4, the insulating film 5, the second magnetic film 6, and the titanium nitride film 7 are successively formed without exposing these construction elements to the atmosphere.

As shown in FIG. 1B, a resist pattern 9 is formed on the silicon oxide film 8 using a photolithography technique. The resist pattern 9 is formed using a resist that is an organic substance. As shown in FIG. 1C, the silicon oxide film 8 is etched using the resist pattern 9 as a mask, thereby forming a silicon oxide film pattern 8'. As will be described later, the silicon oxide film pattern 8' is used as a hard mask.

The etching of the silicon oxide film 8 is performed under a condition where the etching of the silicon oxide film 8 is terminated at the upper surface of the titanium nitride film 7. In more detail, the etching of the silicon oxide film 8 is performed through dry etching using a fluorine-base gas. Consequently, the etching of the silicon oxide film 8 is terminated at the surface of the titanium nitride film 7. The termination of the etching of the silicon oxide film 8 at the surface of the titanium nitride film 7 prevents a situation where the titanium nitride film 7 is erroneously removed and the upper surface of the second magnetic film 6 is exposed.

Referring to FIG. 1D, the resist pattern 9 is removed by ashing in $O_2$ plasma. During this process, the upper surface of the second magnetic film 6 is covered with the titanium nitride film 7 and is not exposed to the $O_2$ plasma. As a result, there is prevented the oxidation of the second magnetic film 6.

As shown in FIG. 1E, the titanium nitride film 7 is etched by reactive ion etching (RIE) using the silicon oxide film pattern 8' as a mask, thereby forming an upper electrode 7'. As will be described later, the upper electrode 7' is used as an upper electrode of a memory cell and is further used as a hard mask during the etching of the second magnetic film 6.

As shown in FIG. 1F, the second magnetic film 6 and the insulating film 5 are etched in succession by ion milling using the silicon oxide film pattern 8' and the upper electrode 7' as a hard mask, thereby forming the free magnetization layer 6' and the insulating layer 5'. During this etching, materials forming the insulating film 5 and the second magnetic film 6 are sputtered and deposited on the side surfaces of the insulating layer 5', the free magnetization layer 6', the upper electrode 7', and the silicon oxide film pattern 8', thereby forming side walls 10. The side walls 10 cover the side surfaces of the free magnetization layer 6' and prevent the oxidation of the side surfaces of the free magnetization layer 6'.

During this process, it is also possible that the insulating film 5 is not etched and is left. However, the insulating film 5 is extremely thin and has a thickness of about 1.5 nm. Therefore, during the actual process, portions of the insulating film 5 other than a portion thereof existing below the upper electrode 7' are removed through etching by ion milling.

Also, it is possible to continuously perform the etching of the titanium nitride film 7 and the second magnetic film 6 by ion milling. Note that in this case, a material forming the titanium nitride film 7 is sputtered and deposited during the ion milling and therefore the side walls 10 are increased in thickness. As a result, it is preferable that like in this embodiment, the titanium nitride film 7 is etched through RIE and the second magnetic film 6 is etched by ion milling.

As shown in FIG. 1G, a silicon oxide film 11 is formed by a CVD method or a sputter method on the entire surface on the upper surface of the substrate 1. As shown in FIG. 1H, a resist pattern 12 is formed on the silicon oxide film 11 using a photolithography technique. The resist pattern 12 is formed using a resist that is an organic substance. The resist pattern 12 is formed so as to cover the entire surface above the free magnetization layer 6' and the upper electrode 7'. As shown in FIG. 1I, the silicon oxide film 11 is etched using the resist pattern 12 as a mask, thereby forming a silicon oxide film pattern 11'. A portion of the first magnetic film 4 that is not covered with the resist pattern 12 is exposed. The silicon oxide film pattern 11' is formed so that each end 11a' thereof is separated from an end of the insulating layer 5'.

Referring to FIG. 1J, the resist pattern 12 is removed by ashing in $O_2$ plasma. During this process, the surface of a portion of the first magnetic film 4 that is not covered with the silicon oxide film pattern 11' is exposed to the $O_2$ plasma and is oxidized, thereby forming oxide layers 4a. However, as will be described later, the portions of the first magnetic film 4 that are exposed to the $O_2$ plasma are removed through etching. Therefore, the oxidation of the surface of the first magnetic film 4 does not lead to the degradation of characteristics of the TMR cell.

Further, during this process, the degradation of the characteristics of the TMR cell is prevented by the construction where each end 11a' of the silicon oxide film pattern 11' is separated from an end of the insulating layer 5'. During the ashing of the resist pattern 12, oxygen enters from each end 11a' of the silicon oxide film pattern 11' toward a portion in which the first magnetic film 4 and the insulating layer 5' contact each other. If oxygen enters into the portion in which the first magnetic film 4 and the insulating layer 5' contact each other, the characteristics of the TMR cell will be degraded. However, each end 11a' of the silicon oxide film pattern 11' is separated from an end of the insulating layer 5', so that there is prevented such a situation where oxygen enters into the portion in which the first magnetic film 4 and the insulating layer 5' contact each other. As a result, the degradation of the characteristics of the TMR cell is prevented.

As shown in FIG. 1K, the first magnetic film 4 and the aluminum film 3 are etched in succession using the silicon oxide film pattern 11' as a mask, thereby forming a fixed magnetization layer 4' and a lower electrode 3'. The etching of the first magnetic film 4 and the aluminum film 3 is performed by ion milling. During this process, each end 4a' of the fixed magnetization layer 4' is formed so as to be displaced from an end of the free magnetization layer 6' in a direction parallel to the surface of the substrate 1. This construction prevents a situation where damage inflicted on an area in the vicinity of each end 4a' of the fixed magnetization layer 4' due to etching causes the degradation of the characteristics of the TMR cell. This is because each end 4a' of the fixed magnetization layer 4' is separated from an end of the free magnetization layer 6' and each portion of the fixed magnetization layer 4' that has been damaged by etching is not used to operate the TMR cell. Accordingly, the characteristics of the TMR cell are not degraded due to damage inflicted on an area in the vicinity of each end 4a' of the fixed magnetization layer 4' during etching. It is noted that side walls are formed on side surfaces of the layers 3' and 4', as same as the side walls 10 in FIG. 1F, though it is not shown. The side walls formed by the process of FIG. 1K are omitted because the side walls do not cause a short circuit between cells.

As shown in FIG. 1L, a silicon oxide is deposited on the entire surface on the substrate 1, thereby forming a silicon oxide film 13. The thickness of the silicon oxide film 13 is about 400.0 nm. The silicon oxide film pattern 8' and the silicon oxide film pattern 11' described above are integrated with the silicon oxide film 13.

As shown in FIG. 1M, a resist pattern 14 is formed on the silicon oxide film 13 using a photolithography technique. As shown in FIG. 1N, the silicon oxide film 13 is etched using the resist pattern 14 as a mask, thereby forming a contact hole 15 reaching the upper electrode 7'. Further, the resist pattern 14 is removed by ashing. As shown in FIG. 1O, a wiring layer 16 is made of a conductive material, such as aluminum. The wiring layer 16 passes through the contact hole 15 and is connected to the upper electrode 7'. As a result of the processes described above, there is obtained the TMR cell.

With the method of manufacturing the magnetic memory of the first embodiment, as shown in FIG. 1D, during the ashing of the resist pattern 9 by $O_2$ plasma, the second magnetic film 6 is covered with the titanium nitride film 7. This prevents a situation where the surface of the second magnetic film 6 is oxidized by the $O_2$ plasma. As a result, the characteristics of the TMR cell are not degraded due to the oxidation of the second magnetic film 6.

Further, with the method of manufacturing the magnetic memory of this embodiment, before the first magnetic film 4 and the second magnetic film 6 are etched by ion milling, the resist pattern 9 and the resist pattern 12 are removed. This prevents a situation where materials forming the first magnetic film 4 and the second magnetic film 6 are sputtered and deposited on the side surfaces of the resist pattern 9 and the resist pattern 12. The materials forming the first magnetic film 4 and the second magnetic film 6 are deposited on the side surfaces of the upper electrode 7', the silicon oxide film pattern 8', and the silicon oxide film pattern 11'. However, the upper electrode 7', the silicon oxide film pattern 8', and the silicon oxide film pattern 11' are used as a part of the TMR cell as they are. Therefore, there is prevented a situation where the side walls formed by the deposition of the materials forming the first magnetic film 4 and the second magnetic film 6 are formed to have a shape where these films 4 and 6 independently protrude. That is, the side walls formed by ion milling are supported by the upper electrode 7', the silicon oxide film pattern 8', and the silicon oxide film pattern 11'. Therefore, the shape thereof is stable. As a result, there are prevented defects in the shape of the MRAM.

Further, with the method of manufacturing the magnetic memory of this embodiment, the sum of thickness of the silicon oxide film pattern 8' and the upper electrode 7' that are used as hard masks is about 150.0 nm and is smaller than the thickness (about 1 μm) of a resist mask that is required to perform ion milling using a resist mask. Further, the silicon oxide film pattern 8' and the upper electrode 7' that are hard masks are not removed but are left as they are, and constitute each part of a magnetic memory. As a result, the occurrence of defects in the shape of the MRAM is prevented.

Further, with the method of manufacturing the magnetic memory of this embodiment, each end 4a' of the fixed magnetization layer 4' is formed so as to be displaced from an end of the free magnetization layer 6' in a direction parallel to the surface of the substrate 1. This prevents the degradation of the characteristics of the TMR cell due to damage inflicted during etching.

It should be noted here that with the method of manufacturing the magnetic memory of this embodiment that forms a TMR cell, a non-magnetic film made of a conductive material that is a diamagnetic substance like copper may be formed instead of the insulating film 5. In this case, it becomes possible to apply the method of manufacturing the magnetic memory of this embodiment to the formation of a GMR cell.

Further, it is possible to modify this embodiment so long as the effect of the present invention is maintained. For instance, it is possible to use an insulating substance, such as a silicon oxynitride film (SiON), instead of the silicon oxide film 2. Further, it is possible to use a film made of a conductive material, such as copper or titanium nitride, instead of the aluminum film 3.

Further, the titanium nitride film 7 and the silicon oxide film 8 that are hard masks may be replaced with films made of other materials. It is possible to use a film made of a conductive material, such as aluminum or tantalum, instead of the titanium nitride film 7. Further, it is possible to use a film made of a material, with which there is obtained selectivity with the titanium nitride film 7 during etching, instead of the silicon oxide film 8. In more detail, it is possible to use a film made of silicon nitride, polysilicon, or another metal instead of the silicon oxide film 8. Note that to make it easy to form the contact hole 15, it is preferable that like in this embodiment, the silicon oxide film 8 is made of a material that is the same as the material of the silicon oxide film 11 and the silicon oxide film 13.

Figure 2A:
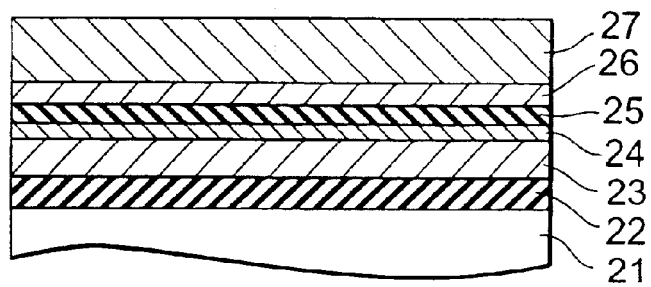
FIGS. 2A to 2N are each a cross sectional view showing a method of manufacturing the magnetic memory of a second embodiment.
Figure 2B:
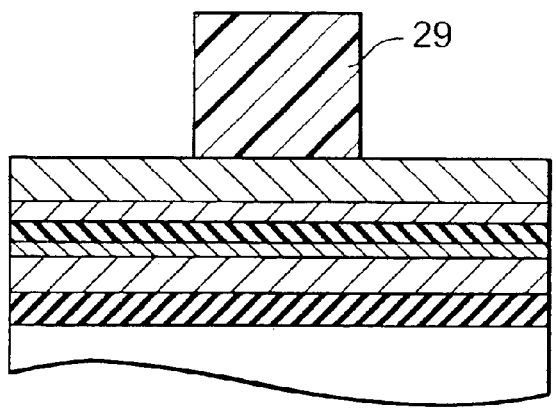
Figure 2C:
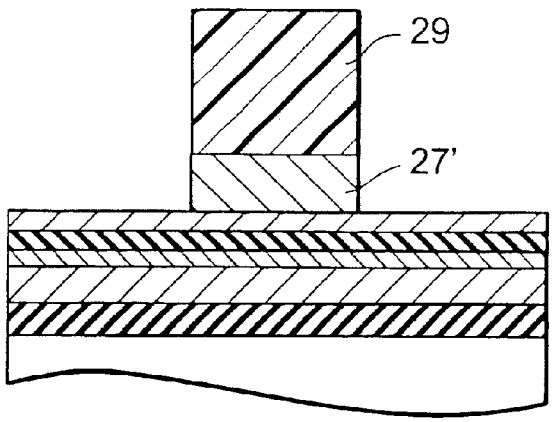
Figure 2D:
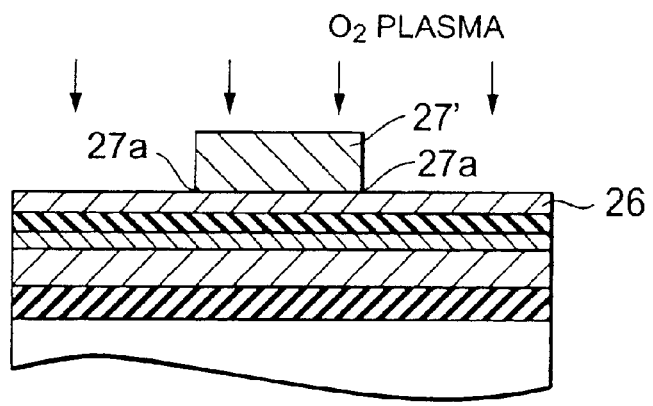
Figure 2E:
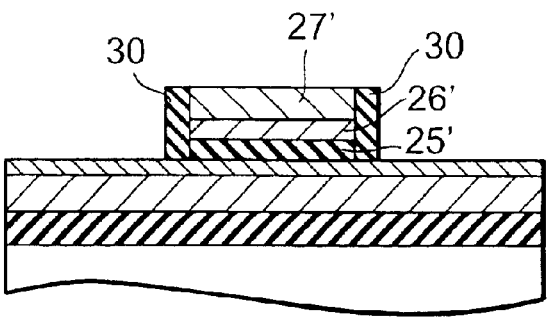
Figure 2F:
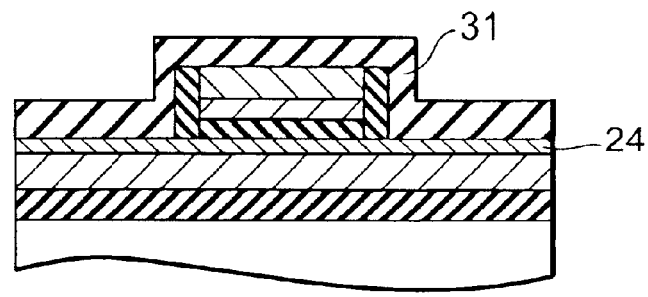
Figure 2G:
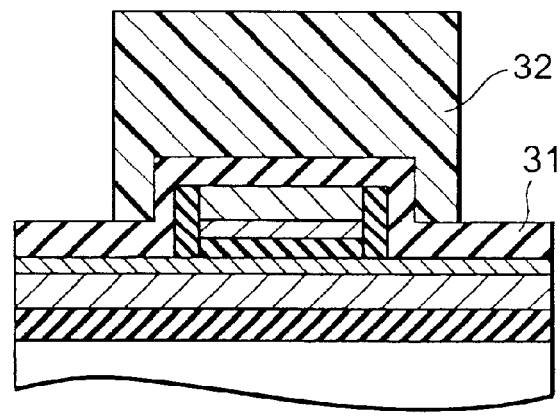
Figure 2H:
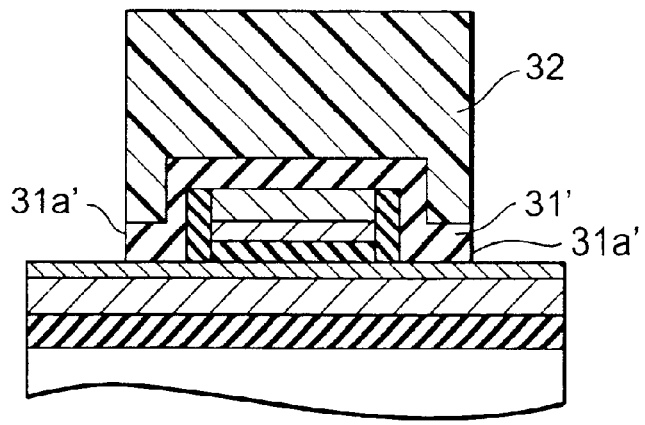
Figure 2I:
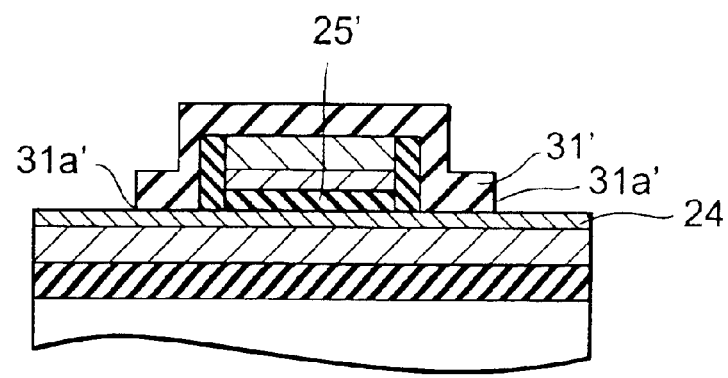
Figure 2J:
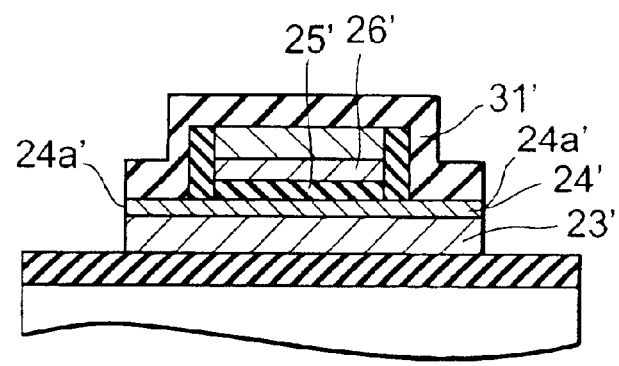
Figure 2K:
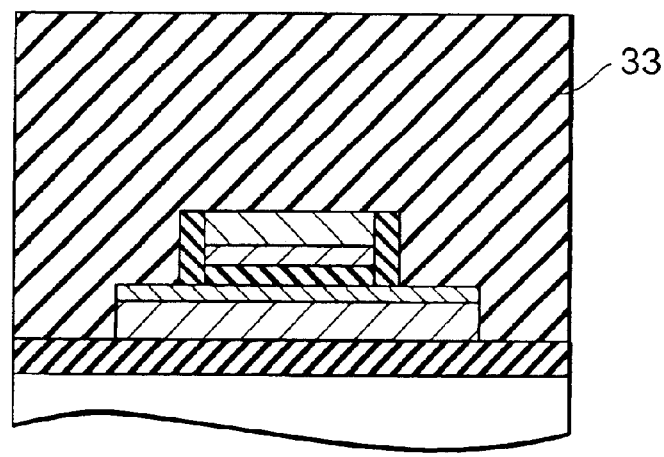
Figure 2L:
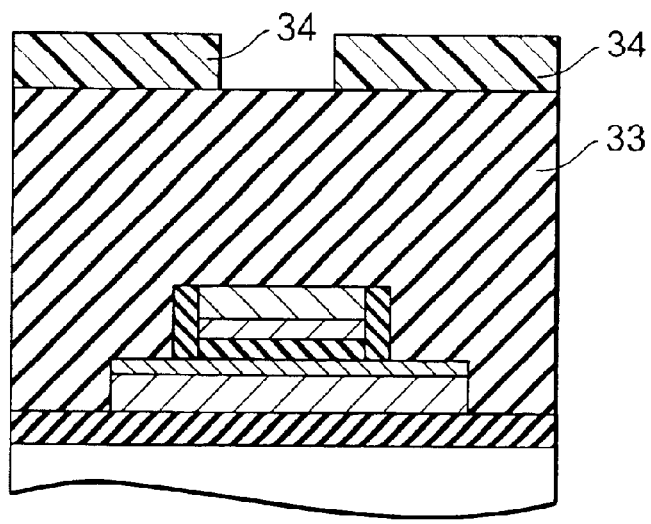
Figure 2M:
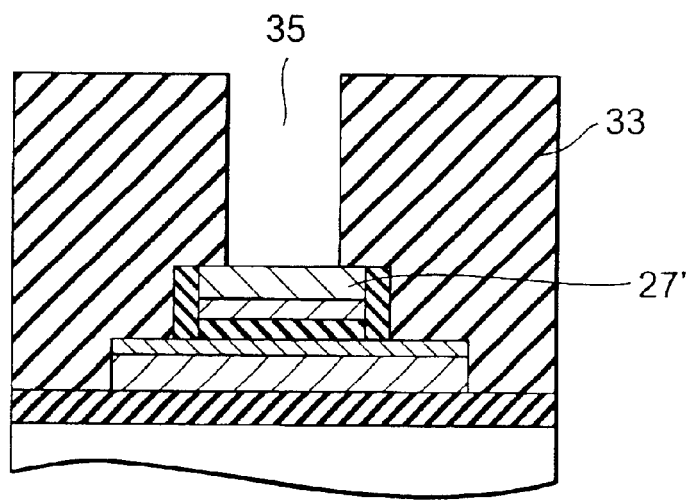
Figure 2N:
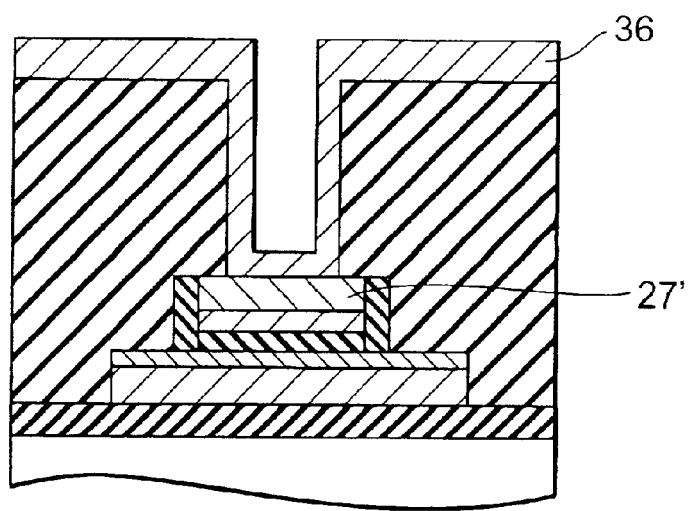
Figure 3A:
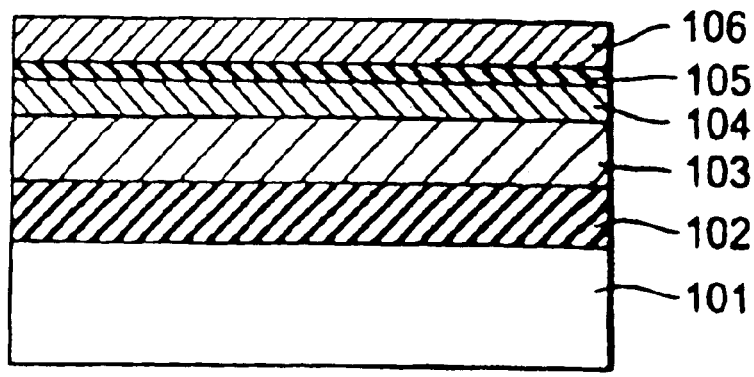
FIGS. 3A to 3I are each a cross sectional view showing a magnetic memory manufacturing method of a related art.
Figure 3B:
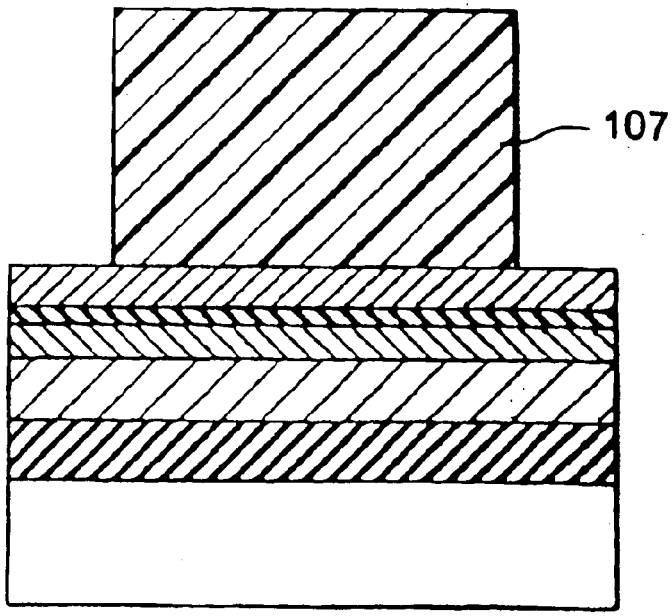
Figure 3C:
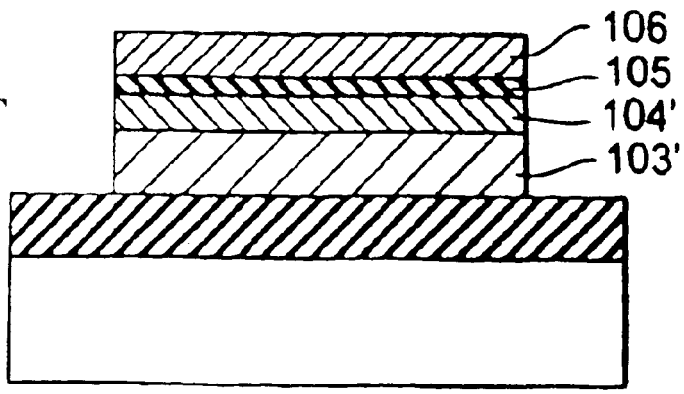
Figure 3D:
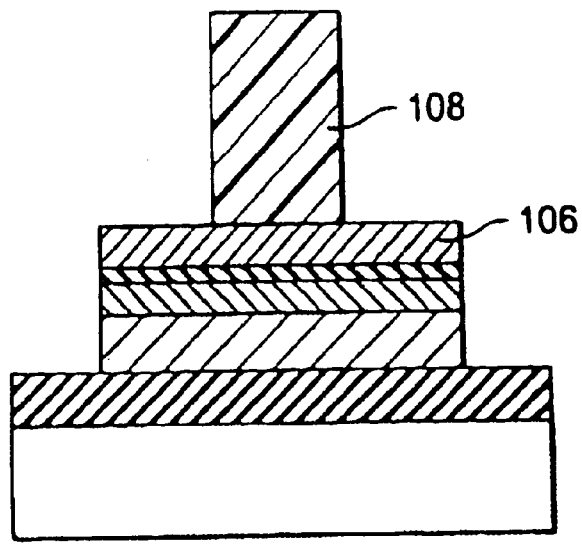
Figure 3E:
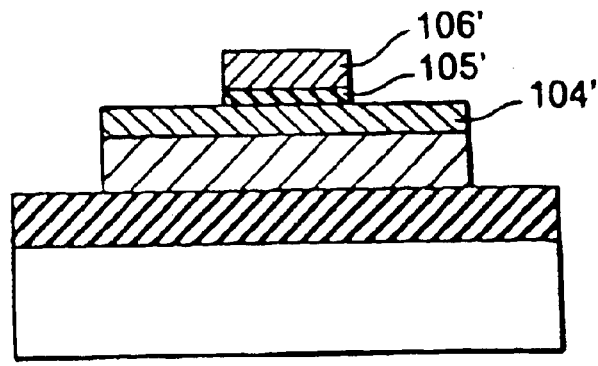
Figure 3F:
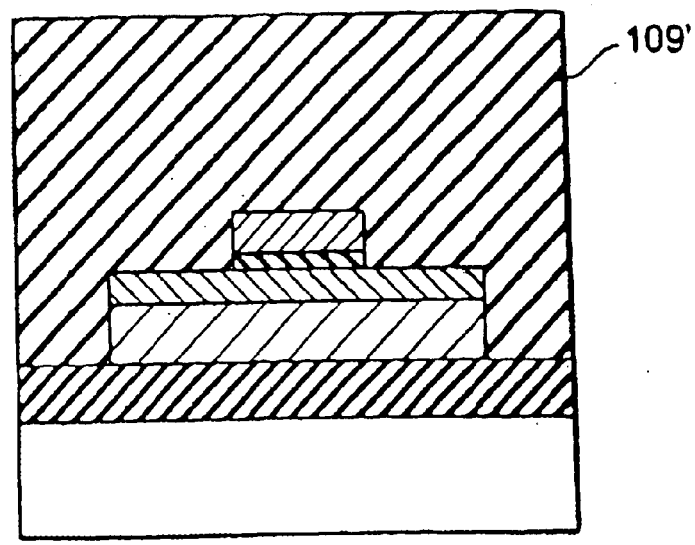
Figure 3G:
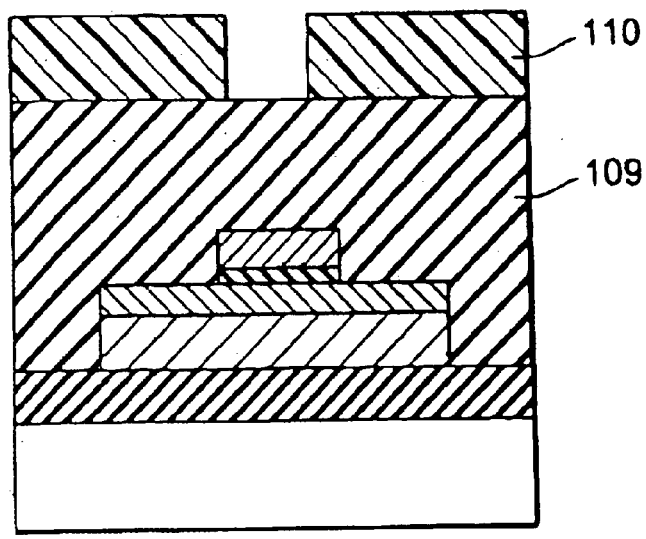
Figure 3H:
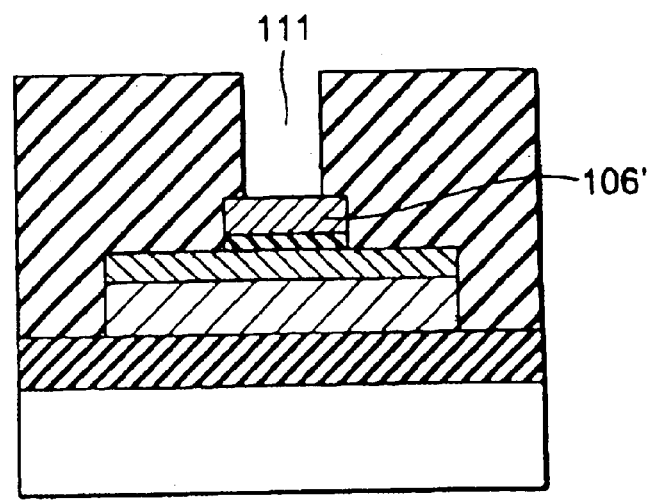
Figure 3I:
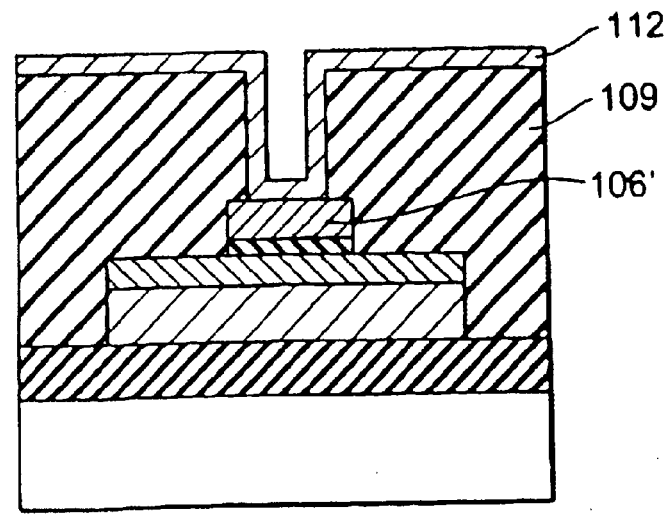
Figure 4:
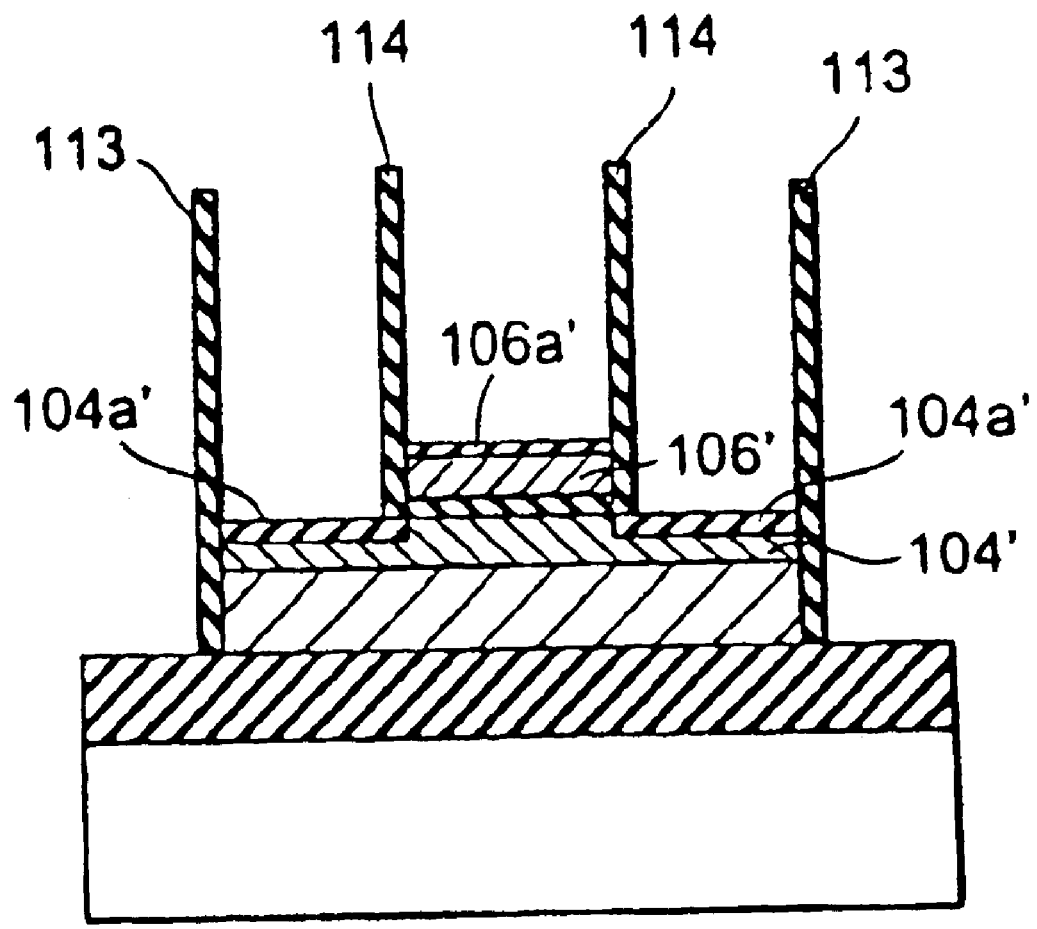
FIG. 4 is a cross sectional view explaining a drawback of the related art.

FIGS. 2A to 2N show a magnetic memory of a second embodiment according to the present invention. This embodiment differs from the first embodiment in that no silicon oxide film is formed on the upper surface of a titanium nitride film that is an upper electrode.

Referring to FIG. 2A, a silicon oxide film 22, an aluminum film 23, a first magnetic film 24, an insulating film 25, a second magnetic film 26, and a titanium nitride film 27 are formed in succession on a substrate 21. The first magnetic film 24 and the second magnetic film 26 are made of a metallic ferromagnetic substance, such as iron, nickel, cobalt, or permalloy (NiFe). The insulating film 25 is made of an insulating material, such as alumina ($Al_2O_3$) or hafnium oxide. The sum of thickness of the first magnetic film 24, the insulating film 25, and the second magnetic film 26 is extremely small and is 30 nm or less. In order to prevent the oxidation of the first magnetic film 24 and the second magnetic film 26, it is preferable that the aluminum film 23, the first magnetic film 24, the insulating film 25, the second magnetic film 26, and the titanium nitride film 27 are successively formed without exposing these construction elements to the atmosphere.

As shown in FIG. 2B, a resist pattern 29 is formed on the titanium nitride film 27 using a photolithography technique. As shown in FIG. 2C, the titanium nitride film 27 is etched, thereby forming the upper electrode 27'. As shown in FIG. 2C, the resist pattern 29 is removed by ashing in $O_2$ plasma. During this process, a part of the surface of the second magnetic film 26 that contacts the upper electrode 27' is not directly exposed to the $O_2$ plasma. That is, a part of the second magnetic film 26 that relates to the operation of a TMR cell is not oxidized.

As shown in FIG. 2E, the second magnetic film 26 and the insulating film 25 are etched in succession by ion milling using the upper electrode 27' as a mask, thereby forming a free magnetization layer 26' and an insulating layer 25'. During this etching, materials forming the insulating film 25 and the second magnetic film 26 are sputtered and deposited on the side surfaces of the insulating layer 25', the free magnetization layer 26', and the upper electrode 27', thereby forming side walls 30. These side walls 30 cover the side surfaces of the free magnetization layer 26' and prevents the oxidation of the side surfaces of the free magnetization layer 26'.

As shown in FIG. 2F, a silicon oxide film 31 is formed on the entire surface on the substrate 21. As shown in FIG. 2G, a resist pattern 32 is formed on the silicon oxide film 31 using a photolithography technique. This resist pattern 32 is formed so as to cover the entire surface above the free magnetization layer 26' and the upper electrode 27'. As shown in FIG. 2H, the silicon oxide film 31 is etched using the resist pattern 32 as a mask, thereby forming the silicon oxide film pattern 31'. Each part of the first magnetization substance film 24 that is not covered with the resist pattern 32 is exposed. The silicon oxide film pattern 31' is formed so that each end 31a' thereof is separated from an end of the insulating layer 25'.

As shown in FIG. 2I, the resist pattern 32 is removed by ashing in $O_2$ plasma. During this process, the surface of the first magnetic film 24 is exposed to the $O_2$ plasma and oxidized. However, as will be described later, each part of the first magnetic film 24 that is exposed to the $O_2$ plasma is removed through etching. As a result, the oxidation of the surface of the first magnetic film 24 does not lead to the degradation of characteristics of a TMR cell. During this process, like in the first embodiment, each end 31a' of the silicon oxide film pattern 31' is separated from an end of the free magnetization layer 26'. As a result, there is prevented the degradation of the characteristics of the TMR cell due to the oxidation of a portion in which the first magnetic film 24 and the insulating layer 25' contact each other.

As shown in FIG. 2J, the first magnetic film 24 and the aluminum film 23 are etched in succession using the silicon oxide film pattern 31' as a mask, thereby forming a fixed magnetization layer 24' and a lower electrode 23'. The etching of the first magnetic film 24 and the aluminum film 23 is performed by ion milling. During this operation, each end 24a' of the fixed magnetization layer 24' is formed so as to be displaced from an end of the free magnetization layer 26' in a direction parallel to the surface of the substrate 21. As a result, like in the first embodiment, there is prevented the degradation of the characteristics of the TMR cell due to damage inflicted on an area in the vicinity of each end 24a' of the fixed magnetization layer 24' during etching. Referring to FIG. 2K, silicon oxide is deposited on the entire surface on the substrate 21, thereby forming a silicon oxide film 33. The silicon oxide film pattern 31' described above is integrated with the silicon oxide film 33.

As shown in FIG. 2L, a resist pattern 34 is formed on the silicon oxide film 33 using a photolithography technique. As shown in FIG. 2M, the silicon oxide film 33 is etched using the resist pattern 34 as a mask, thereby forming a contact hole 35 reaching the upper electrode 27'. Further, the first magnetic film 24 is removed by ashing. As shown in FIG. 2N, a wiring layer 36 is made of a conductive material, such as aluminum. This wiring layer 36 passes through the contact hole 35 and is connected to the upper electrode 27'. As a result of the processes described above, there is obtained the TMR cell.

With the method of manufacturing the magnetic memory of this embodiment, a portion of the free magnetization layer 26' that contacts the upper electrode 27' is not directly exposed to $O_2$ plasma. Accordingly, there is prevented the degradation of the characteristics of the TMR cell due to the oxidation of a portion in which the free magnetization layer 26' and the upper electrode 27' contact each other. Note that with a semiconductor device manufacturing method of the second embodiment, as shown in FIG. 2D, oxygen diffuses to some extent from each end 27a' of the upper electrode 27' toward the inside of a portion in which the free magnetization layer 26' and the upper electrode 27' contact each other. Accordingly, in the case where it is required to reduce the amount of oxygen diffused, it is preferable that the method of manufacturing the magnetic memory of the first embodiment is used. In the case where the diffusion of oxygen from each end 27a' does not cause any problems because the size of the upper electrode 27' is large, it is preferable that there is used the method of manufacturing the magnetic memory of the second embodiment from the viewpoint of reducing the number of manufacturing steps.

Further, with the method of manufacturing the magnetic memory of this embodiment, like with the method of manufacturing the magnetic memory of the first embodiment, the resist pattern 29 and the resist pattern 32 are removed before the first magnetic film 24 and the second magnetic film 26 are etched by ion milling. There does not occur a situation where materials forming the first magnetic film 24 and the second magnetic film 26 are sputtered and deposited on the side surfaces of the resist pattern 29 and the resist pattern 32. As a result, the occurrence of defects in the shape of an MRAM is prevented.

Further, with the method of manufacturing the magnetic memory of this embodiment, like with the method of manufacturing the magnetic memory of the first embodiment, each end 24a' of the fixed magnetization layer 24' is formed so as to be separated from an end of the free magnetization layer 26'. This prevents the degradation of the characteristics of a TMR cell due to damage inflicted during etching.

It should be noted here that with the method of manufacturing the magnetic memory of the second embodiment for forming a TMR cell, a non-magnetic film made of a conductive material that is a diamagnetic substance like copper may be formed instead of the insulating film 25. In this case, it becomes possible to apply the method of manufacturing the magnetic memory of this embodiment to the formation of a GMR cell.

Further, it is possible to modify this embodiment so long as the effect of the present invention is maintained. For instance, it is possible to use an insulating substance, such as a silicon oxynitride film (SiON), instead of the silicon oxide film 22. Further, it is possible to use a film made of a conductive material, such as copper or titanium nitride, instead of the aluminum film 23. Further, it is possible that the titanium nitride film 27 that functions as a hard mask is replaced with a film made of another material that is a conductive material, such as aluminum or tantalum.

With the present invention, there is provided a technique with which a memory cell of an MRAM is formed while suppressing the oxidation of a ferromagnetic film included in the memory cell.

Also, with the present invention, there is provided a technique with which the occurrence of defects in the shape of an MRAM is prevented due to side walls formed on the side surfaces of a mask during the processing of a ferromagnetic film by ion milling.

Also, with the present invention, there is provided a technique with which damage, which is inflicted on a ferromagnetic film during etching of the ferromagnetic film, is prevented from adversely affecting the characteristics of a memory cell of an MRAM.

What is claimed is:

1. A method of forming a magnetic memory, comprising:
   forming a first magnetic film over a substrate;
   forming an intermediate film on said first magnetic film;
   forming a second magnetic film on said intermediate film;
   forming a conductive film on said second magnetic film;
   forming an insulating film on said conductive film;
   forming a resist pattern on said insulating film;
   forming a first pattern by etching said insulating film using said resist pattern as a mask;
   removing said resist pattern;
   forming a second pattern by etching said conductive film using said first pattern as a mask;
   forming a first magnetic substance layer by etching said second magnetic film using said first and second patterns as a mask;
   forming a mask pattern that covers the whole of an upper surface of said first magnetic substance layer; and
   forming a second magnetic substance layer by etching said first magnetic film using said mask pattern as a mask.

2. The method as claimed in claim 1, wherein each end of said second magnetic substance layer is formed so as to be separated from an end of said first magnetic substance layer in a direction parallel to a surface of said substrate.

3. The method as claimed in claim 2, said method further comprising after forming said second magnetic substance layer:
- forming an insulation layer covering said second magnetic substance layer;
- forming a contact hole that passes through said first pattern and reaches said second pattern; and
- forming a wiring layer in said contact hole to electrically connect to said second pattern.

4. A method of forming a magnetic memory, comprising:
- forming a first magnetic film over a substrate;
- forming an intermediate film on said first magnetic film;
- forming a second magnetic film on said intermediate film;
- forming a conductive film on second magnetic film;
- forming a resist pattern on said conductive film;
- forming a first pattern by etching said conductive film using said resist pattern as a mask;
- removing said resist pattern;
- forming a first magnetic substance layer by etching said second magnetic film using said first pattern as a mask;
- forming a mask pattern that covers the whole of an upper surface of said first magnetic substance layer; and
- forming a second magnetic substance layer by etching said first magnetic film using said mask pattern as a mask.

5. The method as claimed in claim 4, wherein each end of said second magnetic substance layer is formed so as to be separated from an end of said first magnetic substance layer in a direction parallel to a surface of said substrate.

6. The method as claimed in claim 5, said method further comprising after forming said second magnetic substance layer:
- forming an insulation layer covering said second magnetic substance layer;
- forming a contact hole that passes through said first pattern and reaches said second pattern; and
- forming a wiring layer in said contact hole to electrically connected to said second pattern.

* * * * *